US011853131B2

(12) United States Patent
Chen et al.

(10) Patent No.: US 11,853,131 B2
(45) Date of Patent: Dec. 26, 2023

(54) CIRCUIT BOARD

(71) Applicant: ASUSTeK COMPUTER INC., Taipei (TW)

(72) Inventors: Po-Ting Chen, Taipei (TW); Chang-Hung Chen, Taipei (TW); Chih-Hung Chuang, Taipei (TW)

(73) Assignee: ASUSTeK COMPUTER INC., Taipei (TW)

( * ) Notice: Subject to any disclaimer, the term of this patent is extended or adjusted under 35 U.S.C. 154(b) by 53 days.

(21) Appl. No.: 17/846,027

(22) Filed: Jun. 22, 2022

(65) Prior Publication Data

US 2023/0251695 A1 Aug. 10, 2023

(30) Foreign Application Priority Data

Feb. 8, 2022 (TW) .................................. 111104448

(51) Int. Cl.
*G06F 1/18* (2006.01)
*H05K 5/02* (2006.01)
*H05K 7/14* (2006.01)

(52) U.S. Cl.
CPC .............. *G06F 1/186* (2013.01); *G06F 1/185* (2013.01); *H05K 5/023* (2013.01); *H05K 7/1402* (2013.01); *H05K 7/1418* (2013.01)

(58) Field of Classification Search
CPC .. H05K 5/0023; H05K 7/1402; H05K 7/1418; G06F 1/185; G06F 1/186
USPC ........................................................ 361/801
See application file for complete search history.

(56) References Cited

U.S. PATENT DOCUMENTS

| | | | | | |
|---|---|---|---|---|---|
| 4,778,401 | A | * | 10/1988 | Boudreau | ............ H05K 7/1409 439/153 |
| 2005/0085113 | A1 | * | 4/2005 | Hill | ..................... H01R 12/7005 439/153 |
| 2008/0316694 | A1 | * | 12/2008 | Yang | ..................... G06F 1/1679 361/679.55 |
| 2010/0136398 | A1 | * | 6/2010 | Chen | ..................... G06F 1/1635 429/100 |
| 2023/0010194 | A1 | * | 1/2023 | Chen | ....................... G06F 1/185 |

FOREIGN PATENT DOCUMENTS

| | | |
|---|---|---|
| CN | 101470476 | 7/2009 |
| CN | 102623816 | 10/2015 |
| CN | 113359951 | 9/2021 |

* cited by examiner

*Primary Examiner* — Hung S. Bui
(74) *Attorney, Agent, or Firm* — JCIPRNET (57) ABSTRACT

A circuit board is applied to be inserted an expansion card, the expansion card includes a positioning part. The circuit board includes a board body, a slot, a release structure and a transmission mechanism. The slot is disposed on the board body. The release structure is movably disposed beside the slot along a first direction, and includes a first inclined surface and a blocking portion for limiting the positioning part. The transmission mechanism includes a linkage part and a forcing part which are linked with each other. The linkage part is connected to the release structure. When the forcing part receives an external force, the linkage part moves to move the release structure to the first direction, and releases the limitation of the positioning part by the blocking portion.

10 Claims, 14 Drawing Sheets

CIRCUIT BOARD

CROSS-REFERENCE TO RELATED APPLICATION

This application claims the priority benefit of Taiwan application serial no. 111104448, filed on Feb. 8, 2022. The entirety of the above-mentioned patent application is hereby incorporated by reference herein and made a part of this specification.

BACKGROUND

Technical Field

The disclosure relates to a circuit board, and in particular to a circuit board applied to be inserted an expansion card.

Description of Related Art

Generally speaking, in order to release the graphics card inserted in the slot on the motherboard, the graphics card release structure (the release structure commonly known as whale tail) beside the slot will be used to release the restriction on the expansion card. However, with the improvement of the specifications of related devices around the motherboard (such as, the increased volume of the CPU tower radiator, the larger size of the cooling components, the increase of the appearance decoration, etc.), after the graphics card is inserted into the slot, most of the area of the graphics card release structure is blocked, making it difficult for users to press. At present, users often use other tools to press the release structure of the graphics card, but doing so often results in damage to the release structure of the graphics card, and it is not easy to press. It may even damage the components on the motherboard, making it impossible to release/replace the graphics card easily, resulting in poor user experience.

SUMMARY

A circuit board is applied to be inserted an expansion card, the expansion card includes a positioning part. The circuit board includes a board body, a slot, a release structure and a transmission mechanism. The slot is disposed on the board body. The release structure is movably disposed beside the slot along a first direction, and includes a first inclined surface and a blocking portion for limiting the positioning part. The transmission mechanism includes a linkage part and a forcing part which are linked with each other. The linkage part is connected to the release structure. When the forcing part receives an external force, the linkage part moves to move the release structure to the first direction, and releases the limitation of the positioning part by the blocking portion.

The circuit board of the disclosure moves the release structure relative to the slot by the transmission mechanism, thereby releasing the expansion card. In this way, even if the release structure is blocked by the expansion card and the heat dissipation module, it is easy for the user to move the release structure.

DESCRIPTION OF THE EMBODIMENTS

Figure 1:
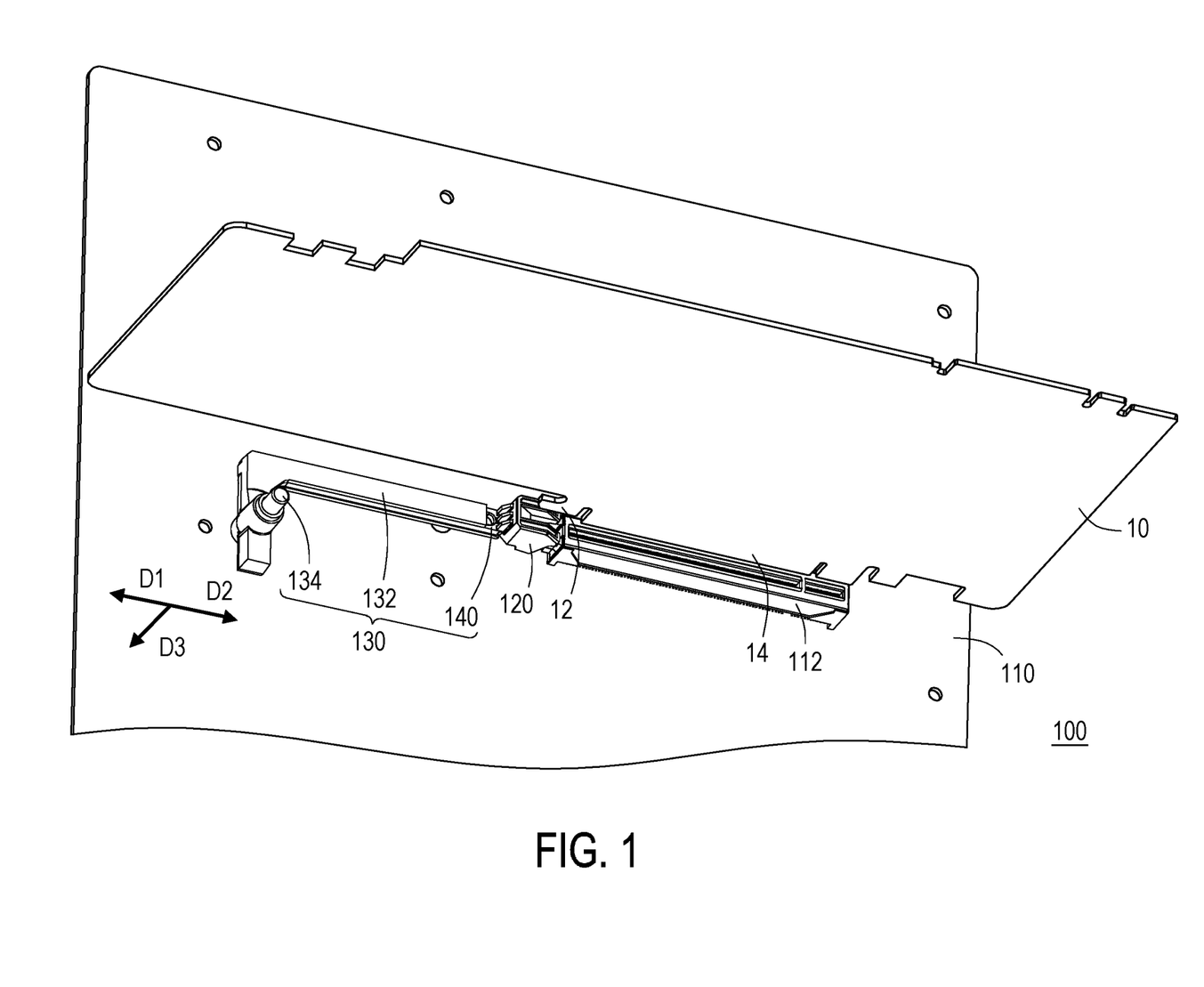
FIG. 1 is a schematic diagram of a circuit board and an uninserted expansion card according to an embodiment of the present disclosure.
Figure 2:
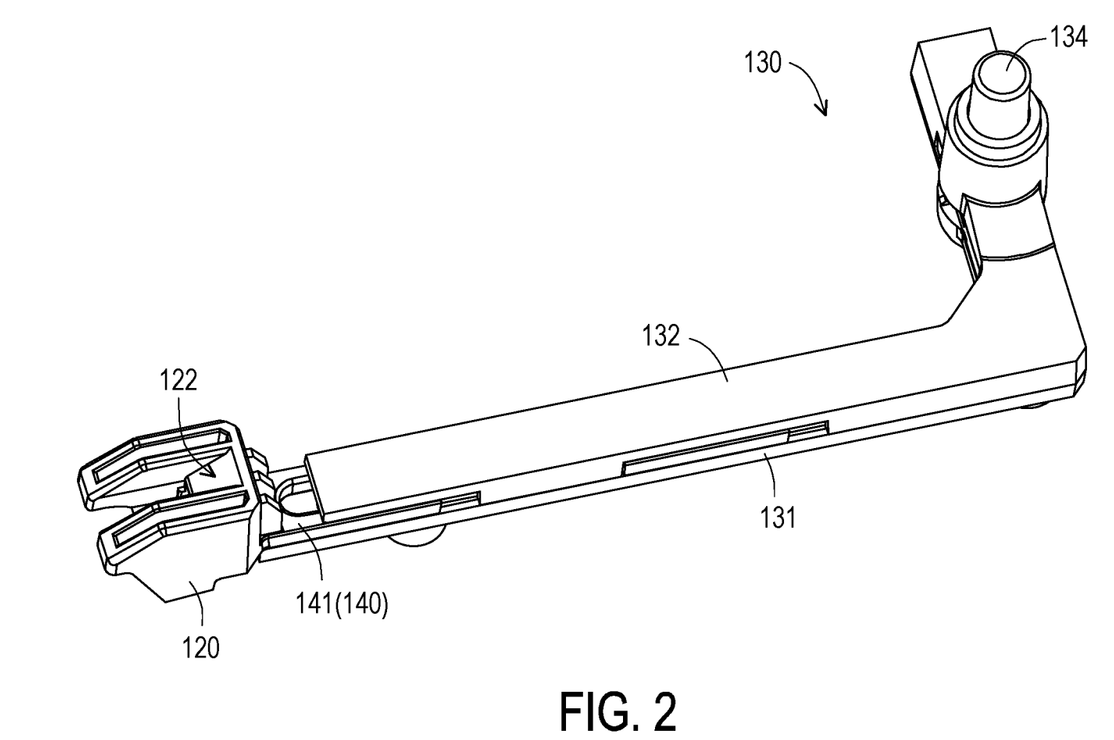
FIG. 2 is a schematic diagram of the release structure and transmission mechanism of FIG. 1.

Referring to FIG. 1, the disclosure provides a circuit board 100, and the circuit board 100 is applied to be inserted an expansion card 10. In an embodiment, the expansion card 10 is, for example, a graphics card, but the type of the expansion card 10 is not limited thereto. The expansion card 10 includes a positioning part 12 and a plug part 14. The expansion card 10 is electrically connected to the circuit board 100 through the plug part 14.

The circuit board 100 includes a board body 110, a slot 112, a release structure 120 and a transmission mechanism 130. The slot 112 is disposed on the board body 110 for being inserted the expansion card 10. In an embodiment, the slot 112 is, such as a PCI-E slot, but the type of the slot 112 is not limited thereto.

In an embodiment, the release structure 120 is movably disposed beside the slot 112 along a first direction D1. When the expansion card 10 is inserted into the slot 112, the release structure 120 is located above the positioning part 12 of the expansion card 10. The positioning part 12 of the expansion card 10 is restricted from moving in a direction away from the circuit board 100, thereby fixing the expansion card 10 in the slot 112.

When the user wants to pull the expansion card 10 out of the slot 112, he just moves the release structure 120 along the first direction D1 to move the release structure 120 away from the positioning part 12, the restriction on the expansion card 10 by the release structure 120 is released.

Figure 5:
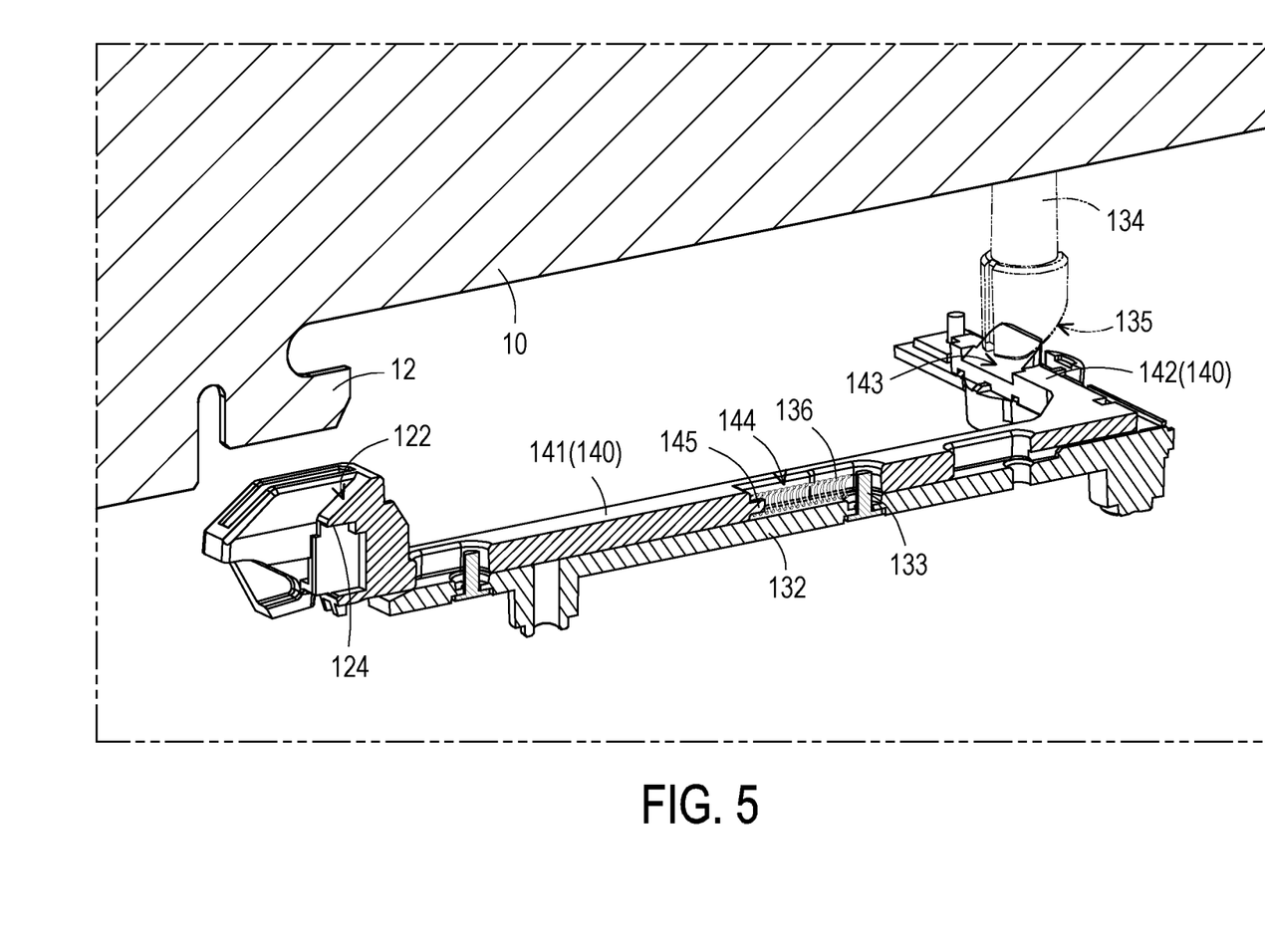
FIG. 5 is a schematic partial cross-sectional view of FIG. 1.

Referring to FIG. 5, the release structure 120 includes a first inclined surface 122 and a blocking portion 124. The blocking portion 124 is located below the first inclined surface 122.

Figure 4:
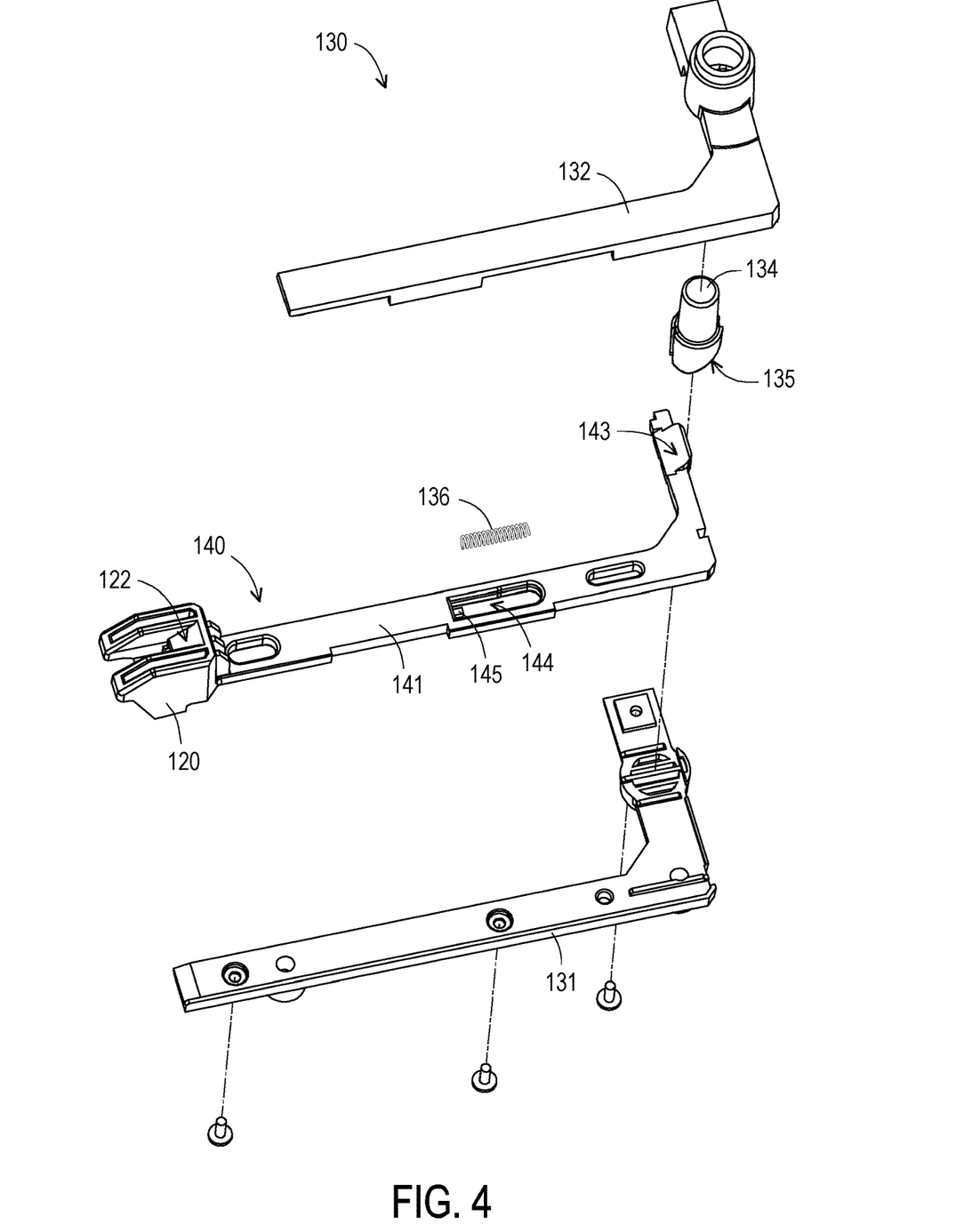
FIG. 4 is an exploded schematic diagram of FIG. 2.

As shown in FIG. 4 and FIG. 5, the transmission mechanism 130 includes a base body 131, an upper cover 132 disposed on the base body 131, a linkage part 140 and a forcing part 134 which are linked with each other. The base body 131 is fixed on the board body 110 (in FIG. 1), the upper cover 132 is fixed on the base body 131. In an embodiment, the fixing method among the board body 110, the base body 131, and the upper cover 132 is, for example, screw connection, but not limited thereto.

Figure 3:
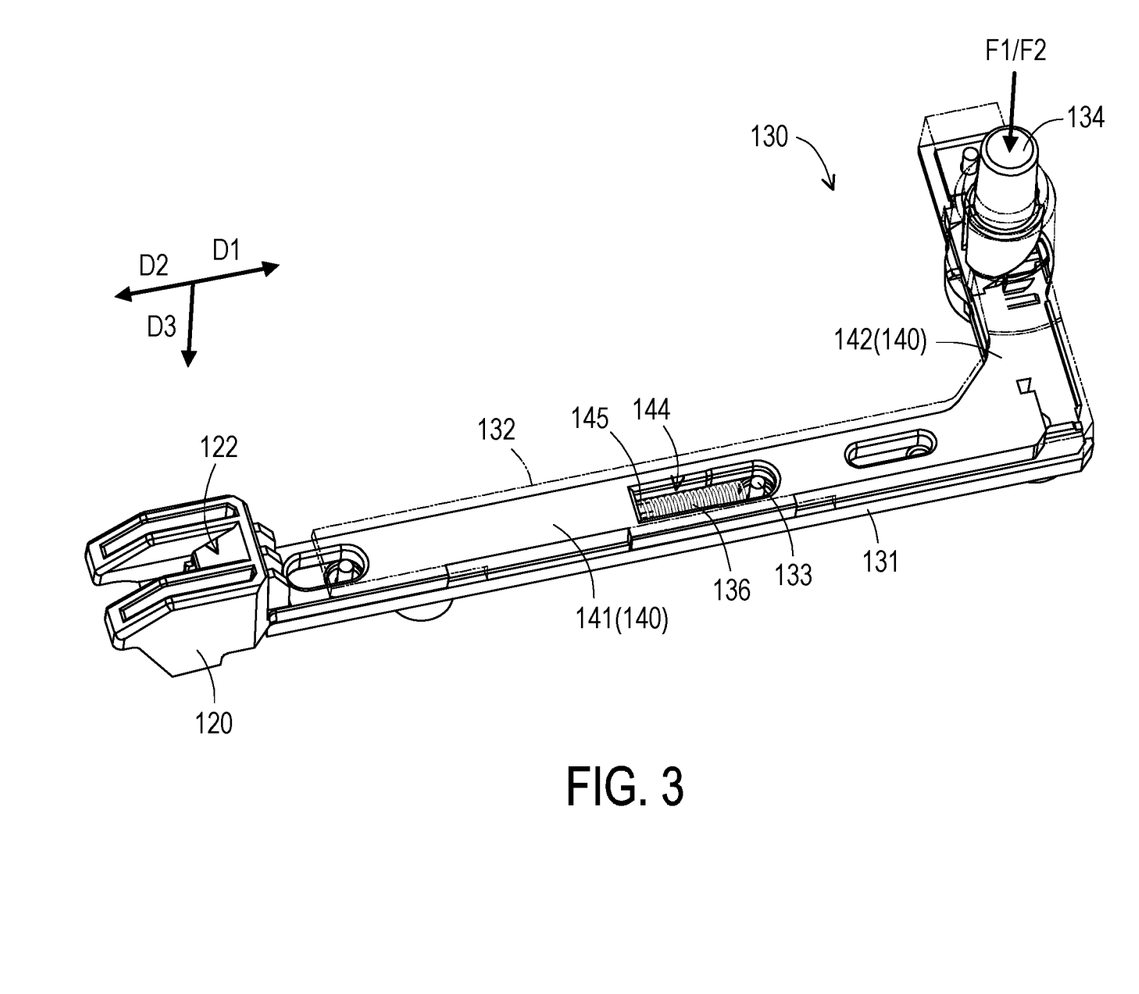
FIG. 3 is a schematic view of the upper cover of FIG. 2 in perspective.

As shown in FIG. 3, the linkage part 140 is movably disposed between the base body 131 and the upper cover 132 along the first direction D1. In an embodiment, the transmission mechanism 130 further includes an elastic element 136, the elastic element 136 is located between the base body 131 and the upper cover 132, extends along the first direction D1, and presses against the linkage part 140. The elastic element 136 is used to help the linkage part 140 to reset.

In an embodiment, the linkage part 140 includes a groove 144 and a protruding post 145 located in the groove 144. The column 133 fixed on the base extends into the groove 144. The elastic element 136 is located in the groove 144. One end of the elastic element 136 is sleeved on the protruding post, and the other end is abutted against the column 133 fixed on the base.

In an embodiment, referring to FIG. 3, the linkage part 140 comprises a first portion 141 and a second portion 142 connected to the first portion 141 in a bent manner. The angle between the first portion 141 and the second portion 142 is, for example, 90 degrees, but not limited thereto.

Referring to FIG. 3, the release structure 120 is connected to the first portion 141, and the forcing part 134 is close to the second portion 142.

In an embodiment, referring to FIG. 5, when the forcing part 134 receives a first external force F1, the forcing part 134 drives the linkage part 140 to move, so as to move the release structure 120 to the first direction D1, and releases the limitation of the positioning part 12 by the blocking portion 124.

In another embodiment, the forcing part 134 is a push-push mechanism, which is adapted to receive a first external force F1 to move down and be fixed below, and is adapted to receive a second external force F2 after the first external force F1 to move up and reset.

Figure 10A:
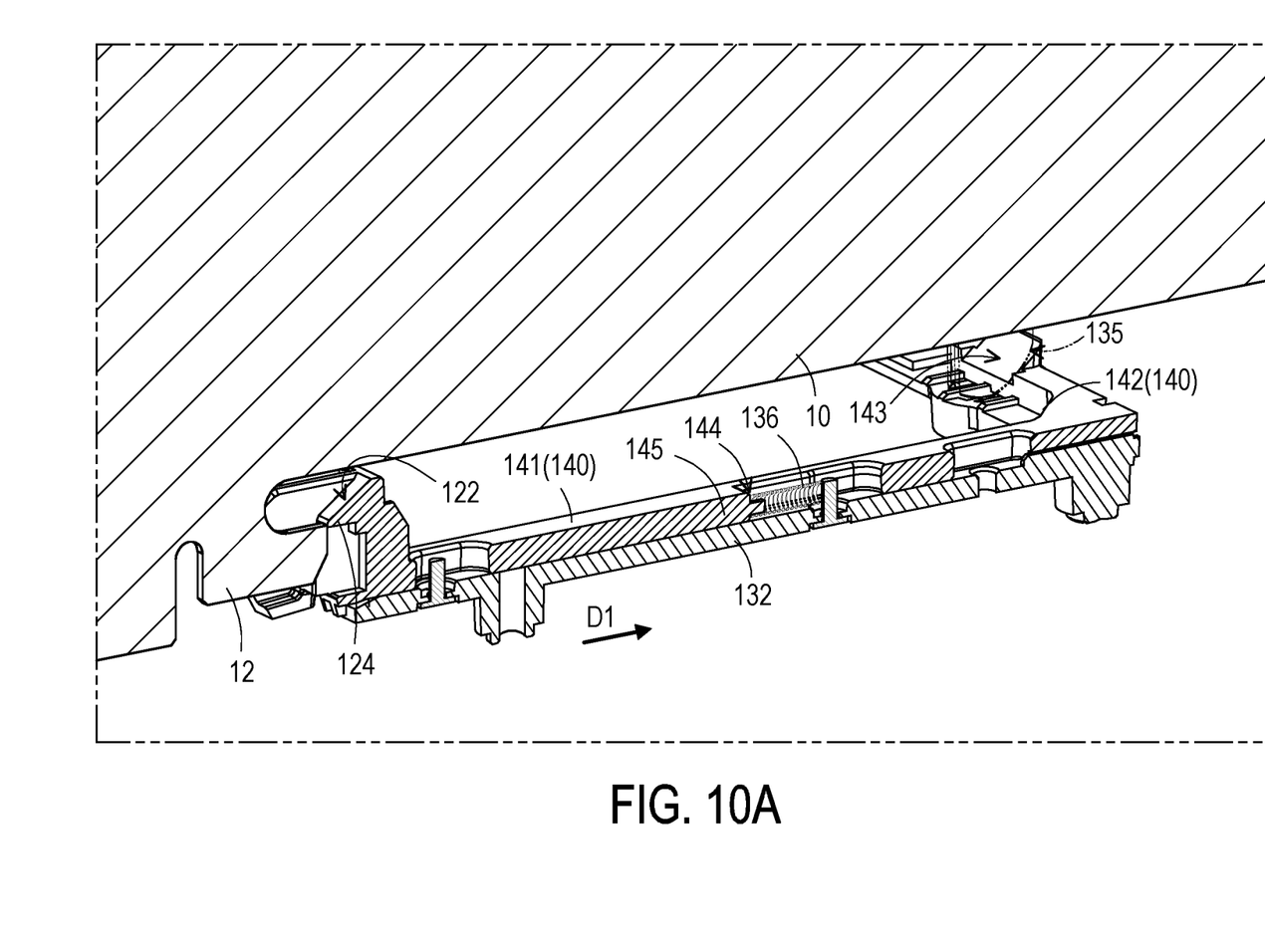
FIG. 10A is a schematic partial cross-sectional view of FIG. 9.
Figure 10B:
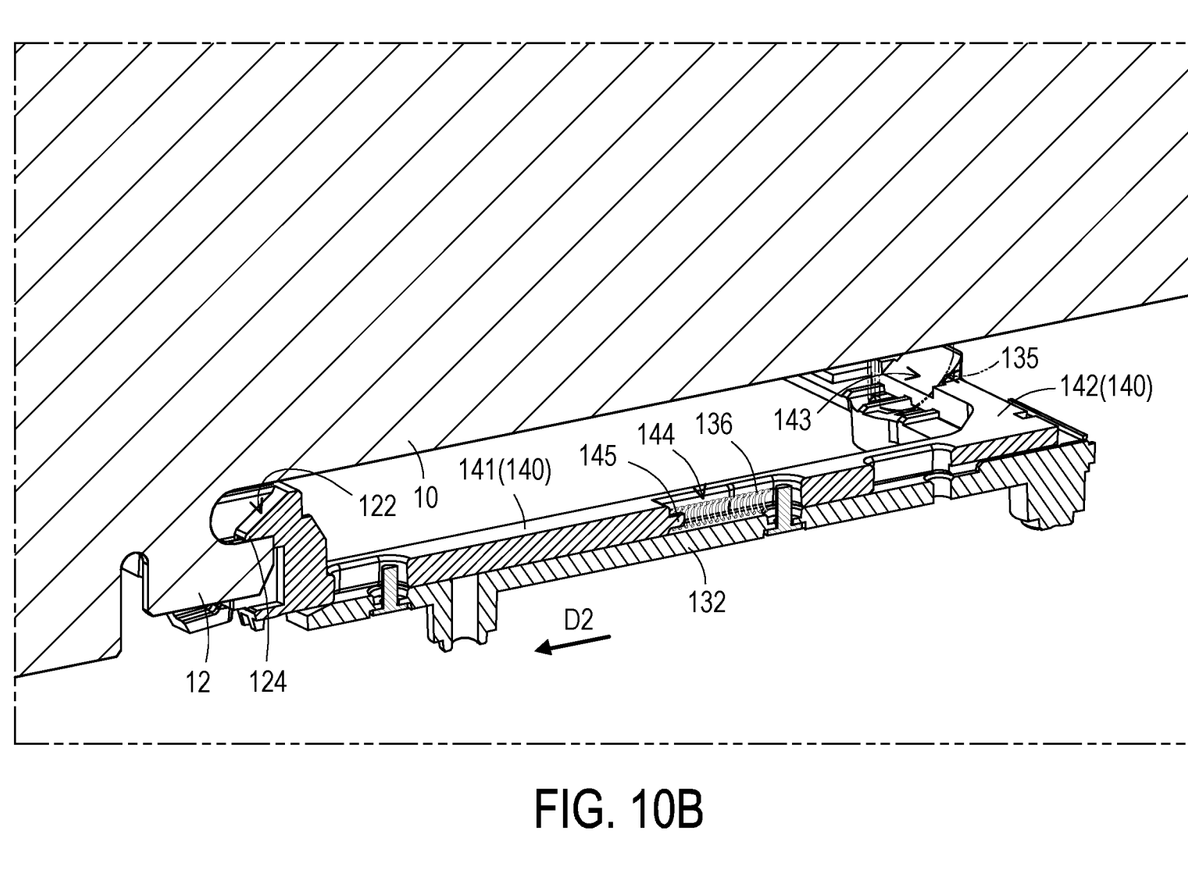
FIG. 10B is a schematic view of the positioning part of FIG. 1 being limited by a blocking portion.

Continuing the above embodiment, when the forcing part 134 receives a first external force F1, the forcing part 134 moves in conjunction with the linkage part 140, so as to move the release structure 120 to the first direction D1, and releases the limitation of the positioning part 12 by the blocking portion 124. When the forcing part 134 receives a second external force F2, the forcing part 134 drives the linkage part 140 to move, so as to move the release structure 120 to a second direction D2, and releases the limitation of the positioning part 12 by the blocking portion 124 as shown in FIG. 10B, wherein the second direction D2 is opposite to the first direction D1.

In an embodiment, the forcing part 134 includes a button movably disposed on the base body 131 along a third direction D3, and the third direction D3 is different from the first direction D1. In the present embodiment, the first direction D1 is perpendicular to the third direction D3, but the relationship between the first direction D1 and the third direction D3 is not limited thereto.

Referring back to FIG. 1, in the present embodiment, the slot 112 and the first portion 141 extend along the first direction D1 and are located on the same extension line, and the forcing part 134 is staggered from the extension line of the slot 112. The disclosure prevents the forcing part 134 from being blocked by the expansion card 10 and the heat dissipation module, which is convenient for the user.

Figure 6:
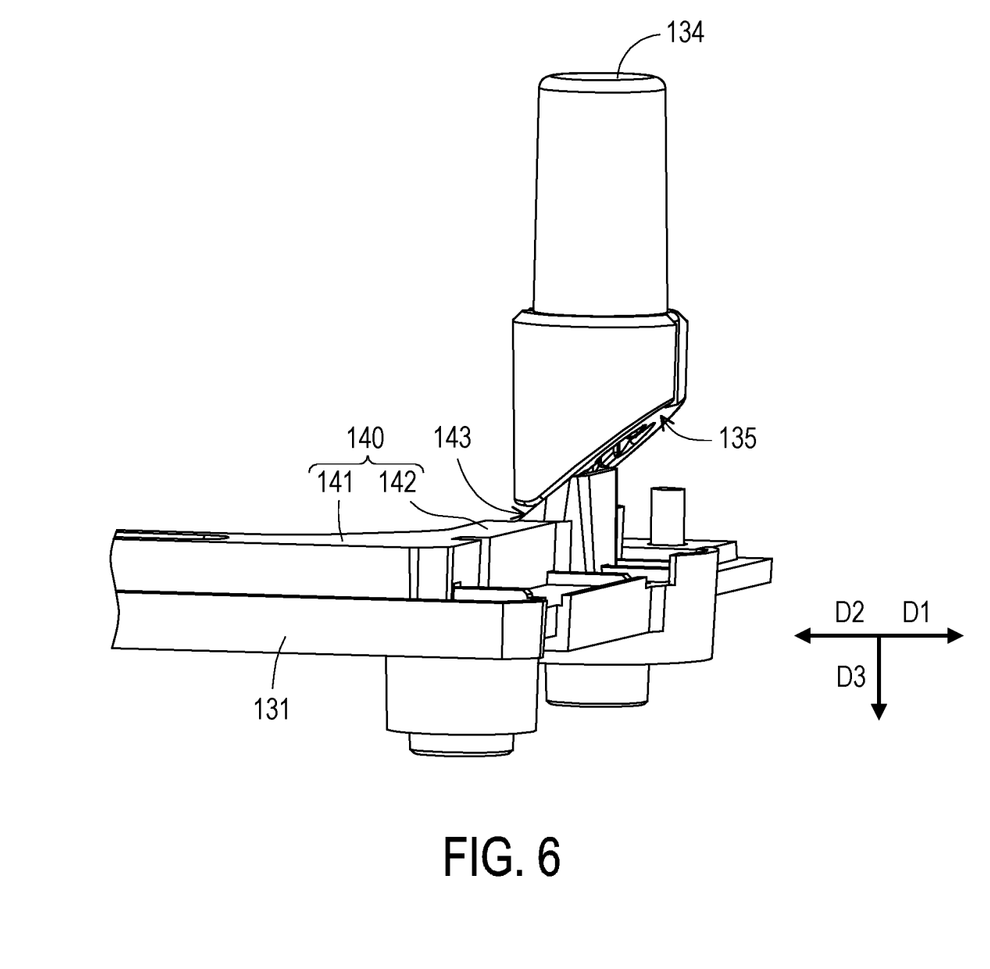
FIG. 6 is a partial schematic view of the release structure and the transmission mechanism of FIG. 1 from another perspective.
Figure 7:
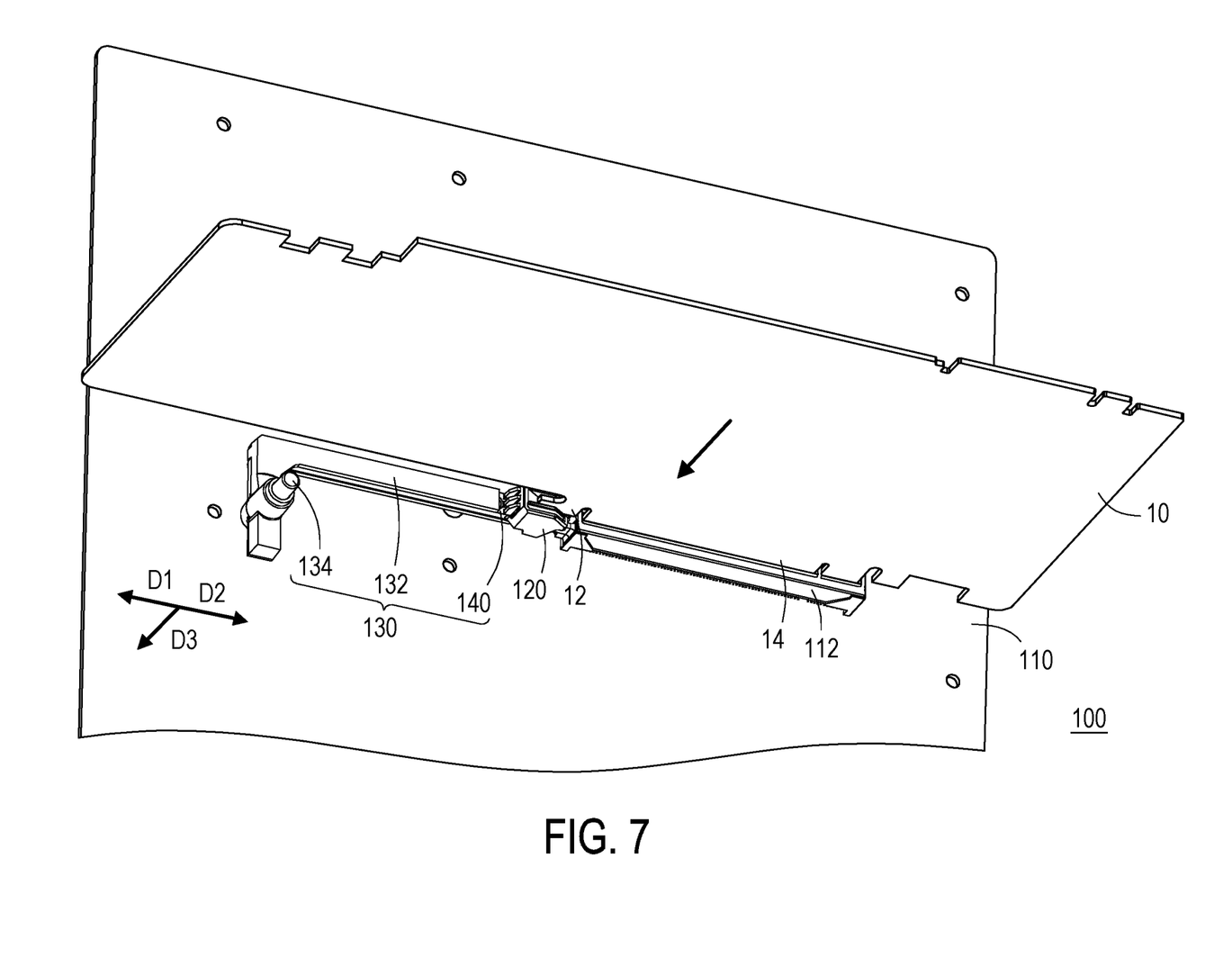
FIG. 7 is a schematic diagram of the expansion card of FIG. 1 moving down to contact the transmission mechanism.

Referring to FIG. 6, the button includes a second inclined surface 135, and the linkage part 140 includes a third inclined surface 143 corresponding to the second inclined surface 135. When the button is pressed along the third direction D3, the second inclined surface 135 cooperates with the third inclined surface 143, so that the linkage part 140 moves to the first direction D1. In this way, the release structure 120 connected to the linkage part 140 can move to the first direction D1, thereby releasing the restriction on the expansion card 10.

Figure 8:
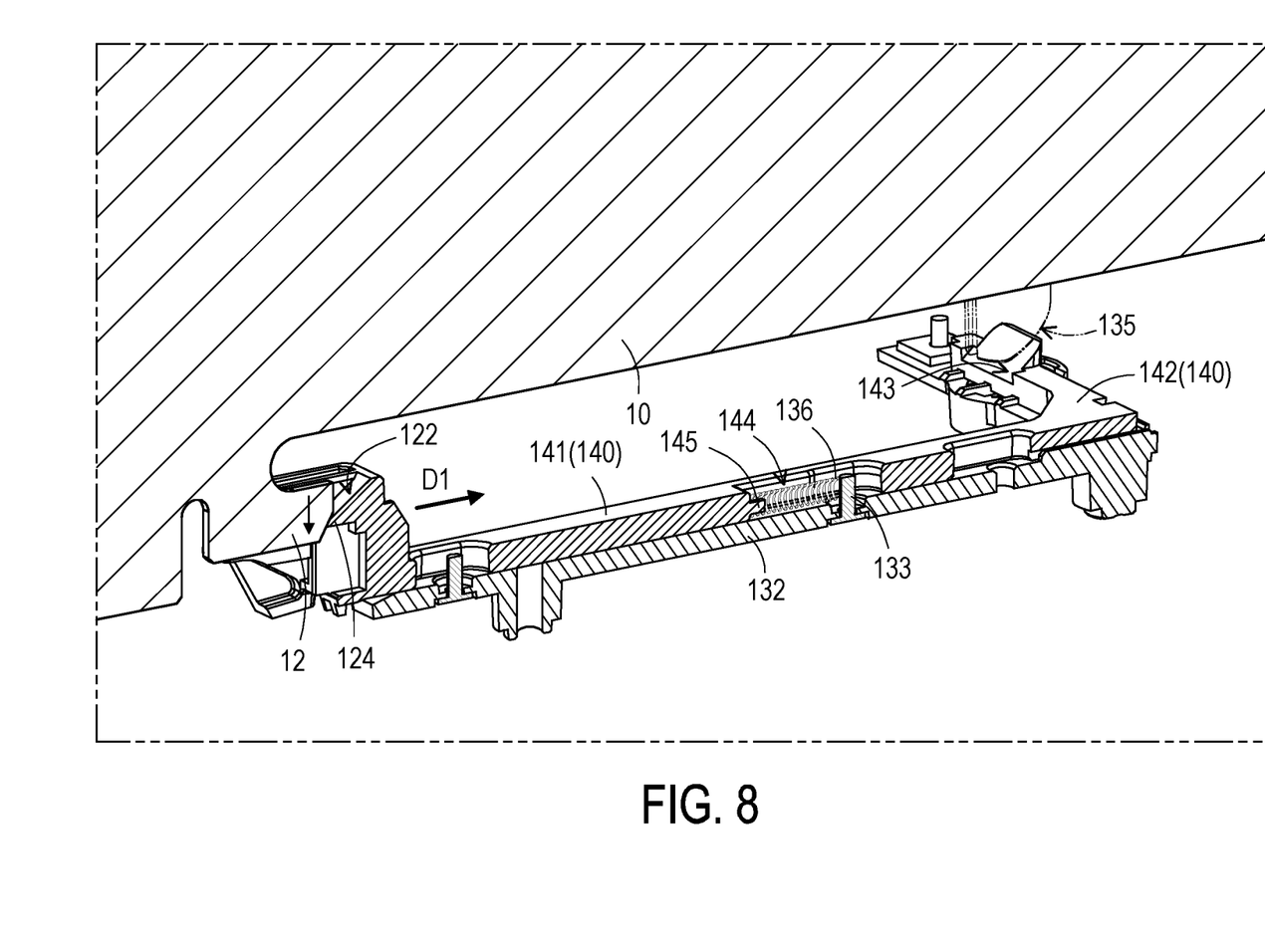
FIG. 8 is a schematic partial cross-sectional view of FIG. 7.
Figure 9:
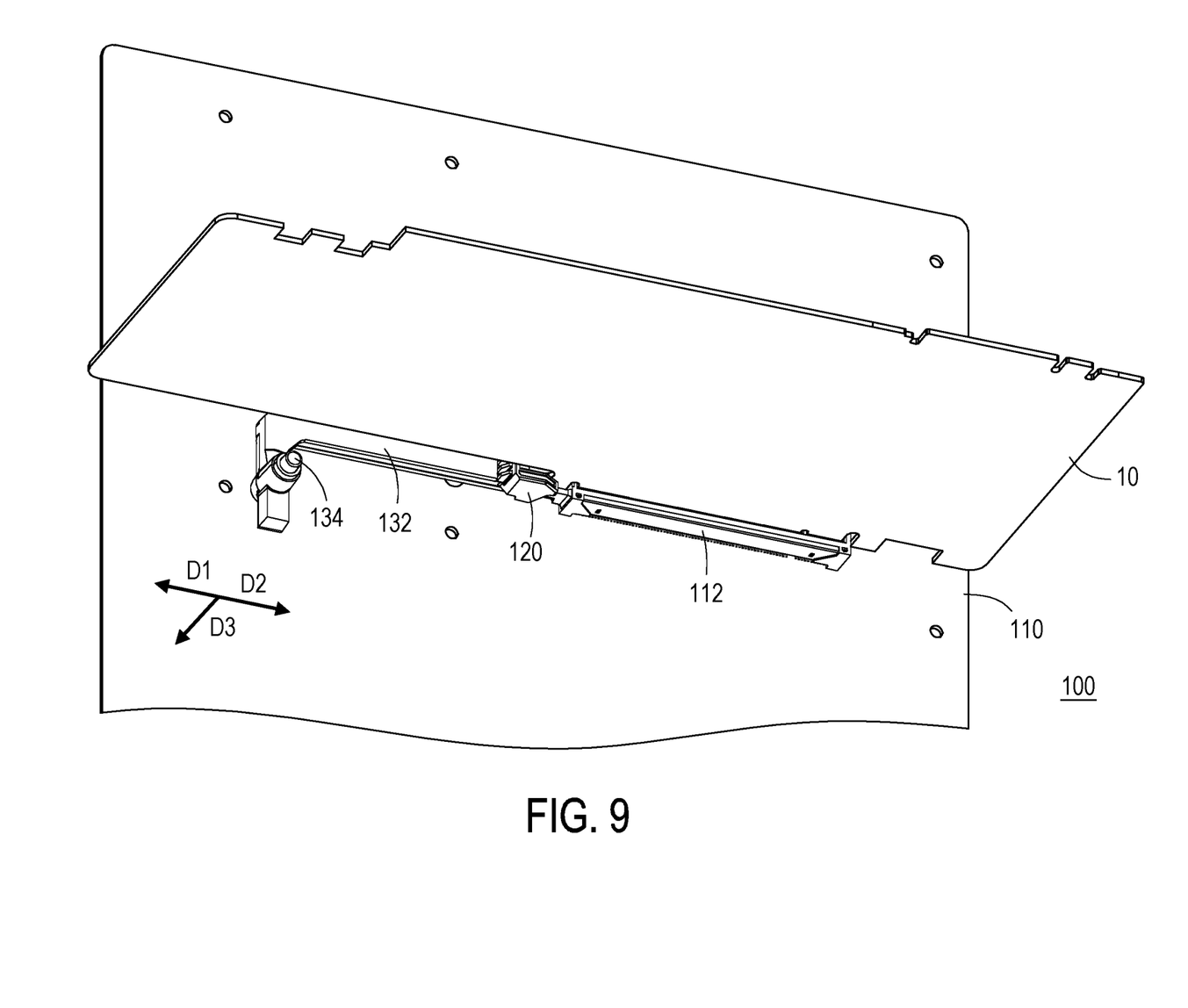
FIG. 9 is a schematic diagram of the expansion card of FIG. 1 being inserted into the slot.

Referring to FIG. 8, during the process of inserting the expansion card 10 into the slot 112, the positioning part 12 pushes against the first inclined surface 122, so that the release structure 120 moves to the first direction D1 and moves out of the slot 112. Referring to FIG. 10A, the positioning part 12 of the expansion card 10 is moved to the bottom of the first inclined surface 122 of the release structure 120. During the process, the elastic element 136 accumulates elastic potential energy.

Then, as shown in FIG. 10B, since the release structure 120 is no longer pushed by the positioning part 12 of the expansion card 10, the elastic element 136 releases the elastic potential energy and pushes the release structure 120 to reset, and the positioning part 12 of the expansion card 10 is restricted by the blocking portion 124 and cannot move upward.

Subsequently, when the user wants to pull out the expansion card 10, he presses the forcing part 134, the forcing part 134 moves down along the third direction D3. The forcing part 134 drives the linkage part 140 to move, so that the release structure 120 moves to the first direction D1 to the position shown in FIG. 10A. Then, the expansion card 10 inserted into the slot 112 can move upward without being restrained by the blocking portion 124, thereby releasing the limitation of the positioning part 12 by the blocking portion 124.

Figure 11:
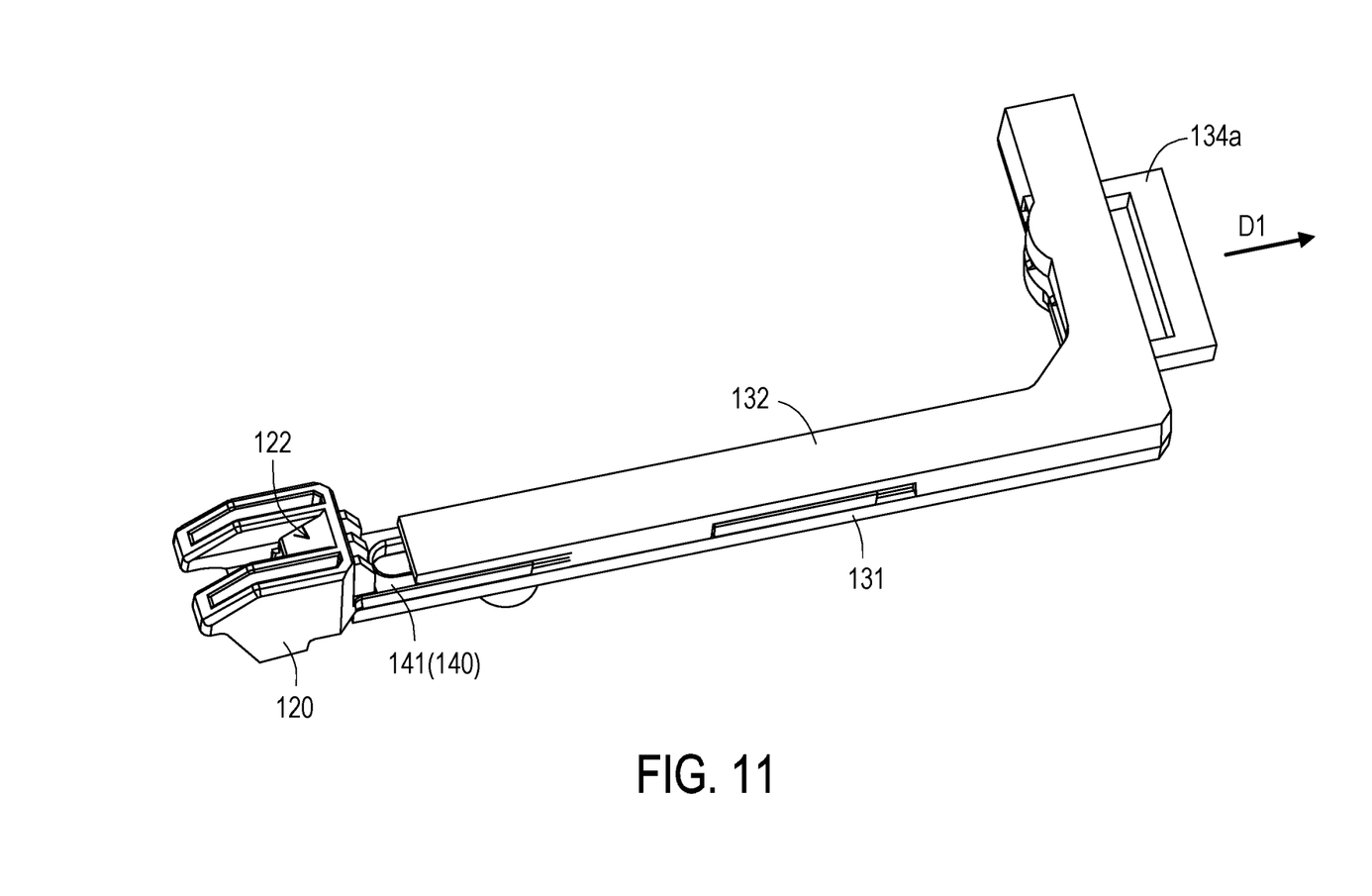
FIG. 11 is a schematic diagram of a release structure and a transmission mechanism according to another embodiment of the present disclosure.
Figure 12:
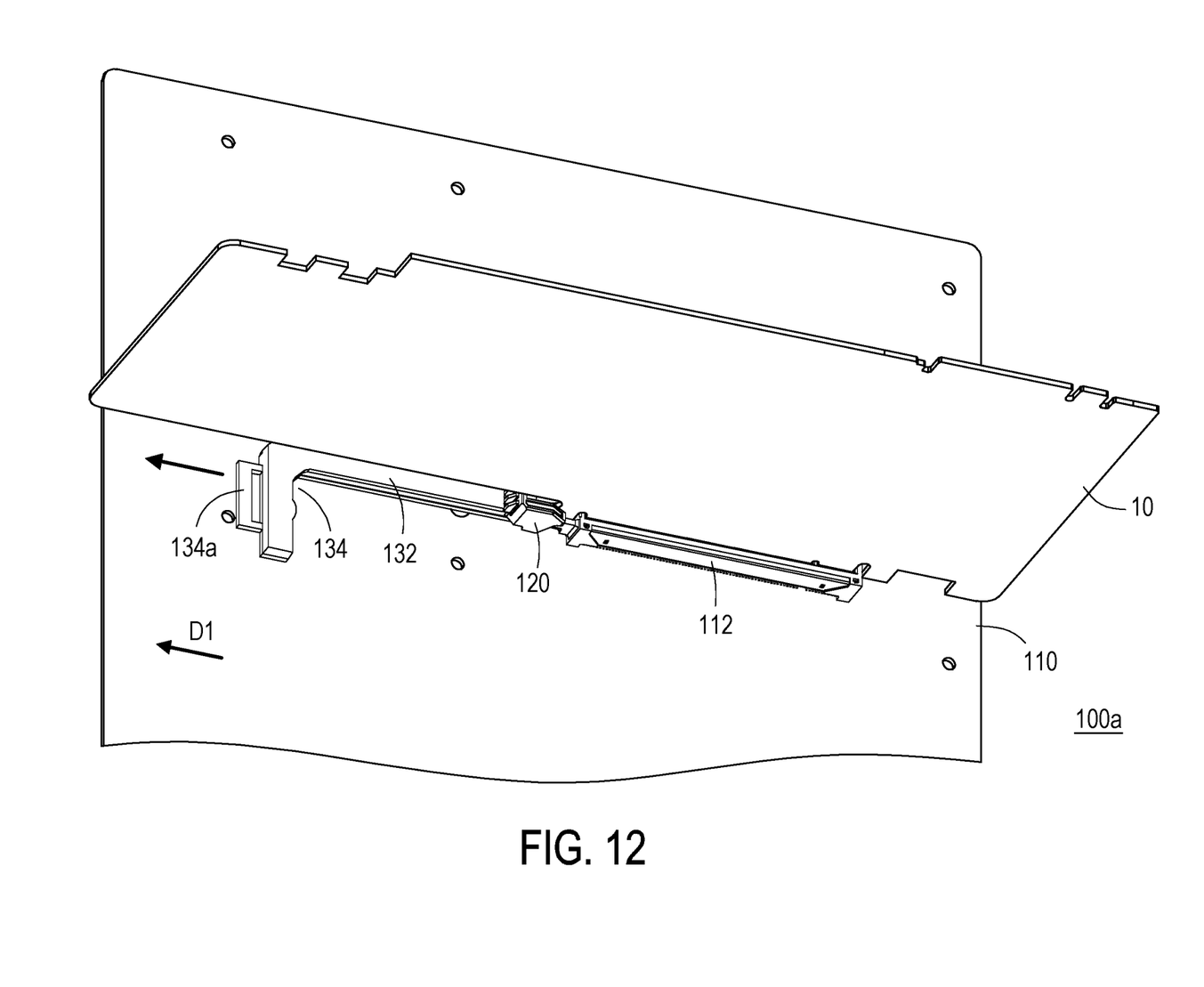
FIG. 12 is a schematic diagram of a circuit board having the release structure and transmission mechanism of FIG. 11.

Referring to FIG. 11 and FIG. 12, in the present embodiment, the forcing part 134a of the circuit board 100a is a pull handle. The moving direction of the forcing part 134a is same as the moving direction (first direction DO of the release structure 120.

Likewise, when the user wants to pull out the expansion card 10, the forcing part 134a is pulled to drive the linkage part 140 to move, so that the release structure 120 moves to the first direction D1 to release the restriction on the expansion card 10.

Figure 13:
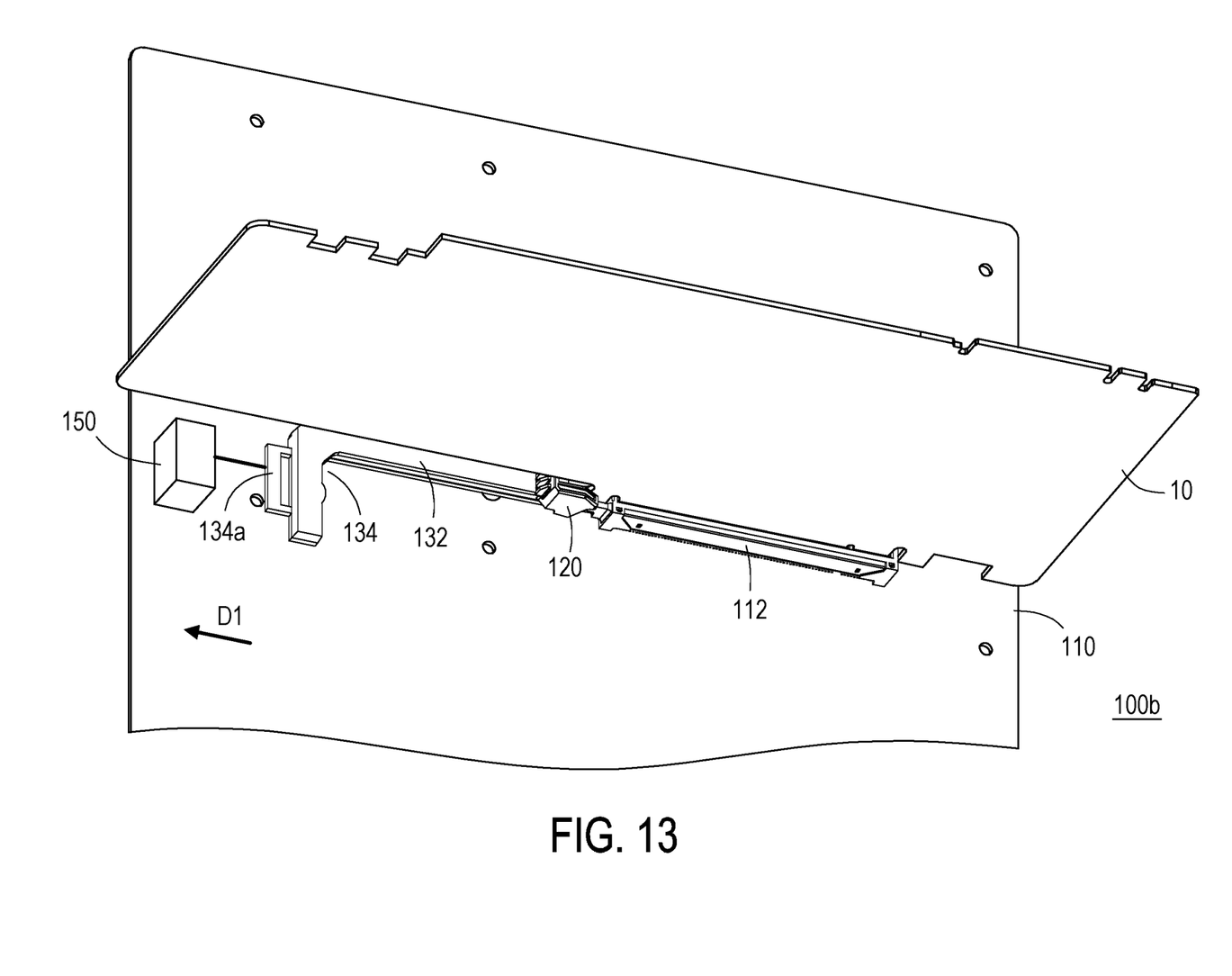
FIG. 13 is a schematic diagram of a circuit board according to another embodiment of the present disclosure.

Referring to FIG. 13, in the present embodiment, the circuit board 100b further includes a driving module 150 which is connected to the forcing part 134 of the transmission mechanism 130, and the forcing part 134 can be moved in an electric way. The driving module 150 is, such as a motor, a hydraulic cylinder, a pneumatic cylinder, an electromagnet, etc., and the type of the driving module 150 is not limited thereto. In addition, the driving module 150 is disposed outside the board body 110 or on the board body 110, and the position of the driving module 150 is adjusted according to the space configuration, which is not limited.

In an embodiment, the forcing part 134 is an input module, such as knob module, touch module, piezoelectric sensor module, etc., which is adapted to receive an input command and transmit the input command to the driving module 150. The driving module 150 is controlled by a control signal to drive the forcing part 134 move. Then, the linkage part 140 is also driven to move, so that the release structure 120 is moved to the first direction D1, and the limitation of the positioning part 12 by the blocking portion 124 is released.

In summary, the circuit board of the disclosure moves the release structure relative to the slot by the transmission mechanism, thereby releasing the expansion card. In this way, even if the release structure is blocked by the expansion card and the heat dissipation module, it is easy for the user to move the release structure.

What is claimed is:

1. A circuit board, applied to be inserted an expansion card, the expansion card comprises a positioning part, the circuit board comprising:
   a board body;
   a slot, disposed on the board body;
   a release structure, movably disposed beside the slot along a first direction, and comprises a first inclined surface and a blocking portion, wherein the blocking portion is suitable for limiting the positioning part; and
   a transmission mechanism, comprises a linkage part and a forcing part which are linked with each other, wherein the linkage part is connected to the release structure,
   wherein, when the forcing part receives a first external force, the linkage part moves to move the release structure to the first direction, and releases the limitation of the positioning part by the blocking portion,
   wherein the linkage part comprises a first portion and a second portion connected to the first portion in a bent manner, the release structure is connected to the first portion, and the forcing part is close to the second portion.

2. The circuit board according to claim 1, wherein when the forcing part receives a second external force, the linkage part moves to move the release structure to a second direction, and releases the limitation of the positioning part by the blocking portion, wherein the second direction is opposite to the first direction.

3. The circuit board according to claim 1, wherein the transmission mechanism further comprises a base body and an upper cover disposed on the base body, the base body is fixed on the board body, and the linkage part is movably disposed between the base body and the upper cover.

4. The circuit board according to claim 3, wherein the forcing part comprises a button movably disposed on the base body along a third direction, and the third direction is different from the first direction.

5. The circuit board according to claim 4, wherein the button comprises a second inclined surface, and the linkage part comprises a third inclined surface corresponding to the second inclined surface.

6. The circuit board according to claim 3, wherein the transmission mechanism further comprises an elastic element, the elastic element is located between the base body and the upper cover, extends along the first direction, and presses against the linkage part.

7. The circuit board according to claim 6, wherein the linkage part comprises a groove and a protruding post located in the groove, and the elastic element is located in the groove and sleeved on the protruding post.

8. The circuit board according to claim 1, wherein the slot and the first portion extend along the first direction, and the forcing part is staggered from the extension line of the slot.

9. The circuit board according to claim 1, wherein the forcing part is a pull handle, a push-push mechanism or an input module.

10. The circuit board according to claim 1, further comprises:
    a driving module, connected to the forcing part of the transmission mechanism.

* * * * *